(12) United States Patent
Cloetens

(10) Patent No.: US 8,639,468 B2
(45) Date of Patent: Jan. 28, 2014

(54) DIE TEMPERATURE ESTIMATOR

(75) Inventor: Henri Cloetens, Kapelle Op Den Bos (BE)

(73) Assignee: Freescale Semiconductor, Inc., Austin, TX (US)

(*) Notice: Subject to any disclaimer, the term of this patent is extended or adjusted under 35 U.S.C. 154(b) by 341 days.

(21) Appl. No.: 13/056,322

(22) PCT Filed: Jul. 30, 2008

(86) PCT No.: PCT/IB2008/053060
§ 371 (c)(1),
(2), (4) Date: Jan. 28, 2011

(87) PCT Pub. No.: WO2010/013093
PCT Pub. Date: Feb. 4, 2010

(65) Prior Publication Data
US 2011/0131004 A1 Jun. 2, 2011

(51) Int. Cl.
*G01K 1/08* (2006.01)
(52) U.S. Cl.
USPC .......................................................... 702/132
(58) Field of Classification Search
USPC .......................................................... 702/132
See application file for complete search history.

(56) References Cited

U.S. PATENT DOCUMENTS

| 5,287,292 | A | 2/1994 | Kenny et al. |
| 5,422,806 | A | 6/1995 | Chen et al. |
| 6,006,168 | A | 12/1999 | Schumann et al. |
| 2003/0158697 | A1* | 8/2003 | Gold et al. ................ 702/132 |
| 2004/0267409 | A1 | 12/2004 | De Lorenzo et al. |
| 2007/0081575 | A1* | 4/2007 | Liu et al. .................... 374/111 |

OTHER PUBLICATIONS

International Search Report and Written Opinion correlating to PCT/IB2008/053060 dated May 19, 2009.

\* cited by examiner

*Primary Examiner* — Michael Nghiem

(57) ABSTRACT

A temperature estimation circuit for estimating a temperature of an integrated circuit die comprises a temperature increase estimation circuit, having inputs operable to receive notification signals, each corresponding to a command signal passed to an integrated circuit, and an output providing a sum of temperature increase values, each corresponding to a temperature increase of the integrated circuit due to one of the command signals. The circuit further comprises a temperature decrease estimation circuit, having an input operable to receive a calculated die temperature value, and an output providing a temperature decrease value depending on a mathematical model of temperature decrease when no command signal is applied. The circuit further comprises a temperature calculation circuit, having a first input connected to the output of the temperature increase estimation circuit, a second input connected to the output of the temperature decrease estimation circuit, and an output providing the calculated die temperature value.

20 Claims, 4 Drawing Sheets

DIE TEMPERATURE ESTIMATOR

FIELD OF THE INVENTION

This invention in general relates to electronic devices, and more specifically to a die temperature estimation circuit and a method for estimating a temperature of an integrated circuit die.

BACKGROUND OF THE INVENTION

Multiple integrated circuits are manufactured using large semiconductor wafers. After the processing of a wafer is accomplished, the wafer is diced, i.e. individual silicon chips or integrated circuits on a silicon wafer are separated. A die in the context of integrated circuits is a small block of semiconducting material, on which a given functional circuit is fabricated. Since each current flow through an electronic device having a resistance causes the device to increase temperature and dissipate heat energy, performance parameters of any such device are subject to change due to the temperature change, for semiconducting devices especially the junction temperature change. Overheating may cause a device to fail temporarily or even destroy the device permanently. This is especially relevant for integrated circuit devices used in a safety-critical environment, for example in car safety systems, where failure of the device may result in a danger for the driver. Therefore, for some applications, the temperature of an integrated circuit being in use connected to a system (for example on a printed circuit board) is measured by a temperature sensor. However, a temperature sensor adds additional costs and requires space for the sensor device and its connections. Furthermore, it is not possible to measure a temperature without adding noise to the measured value due to usage of the measurement device.

SUMMARY OF THE INVENTION

The present invention provides a temperature estimation circuit and a method for estimating a temperature of an integrated circuit die as described in the accompanying claims. It further provides a data processing system, a safety critical system, and a vehicle comprising the described temperature estimation circuit and a computer program product at least partly implementing the temperature estimation.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Identical reference numerals in different figures refer to identical or similar components.

DETAILED DESCRIPTION OF THE PREFERRED EMBODIMENTS

Figure 1:
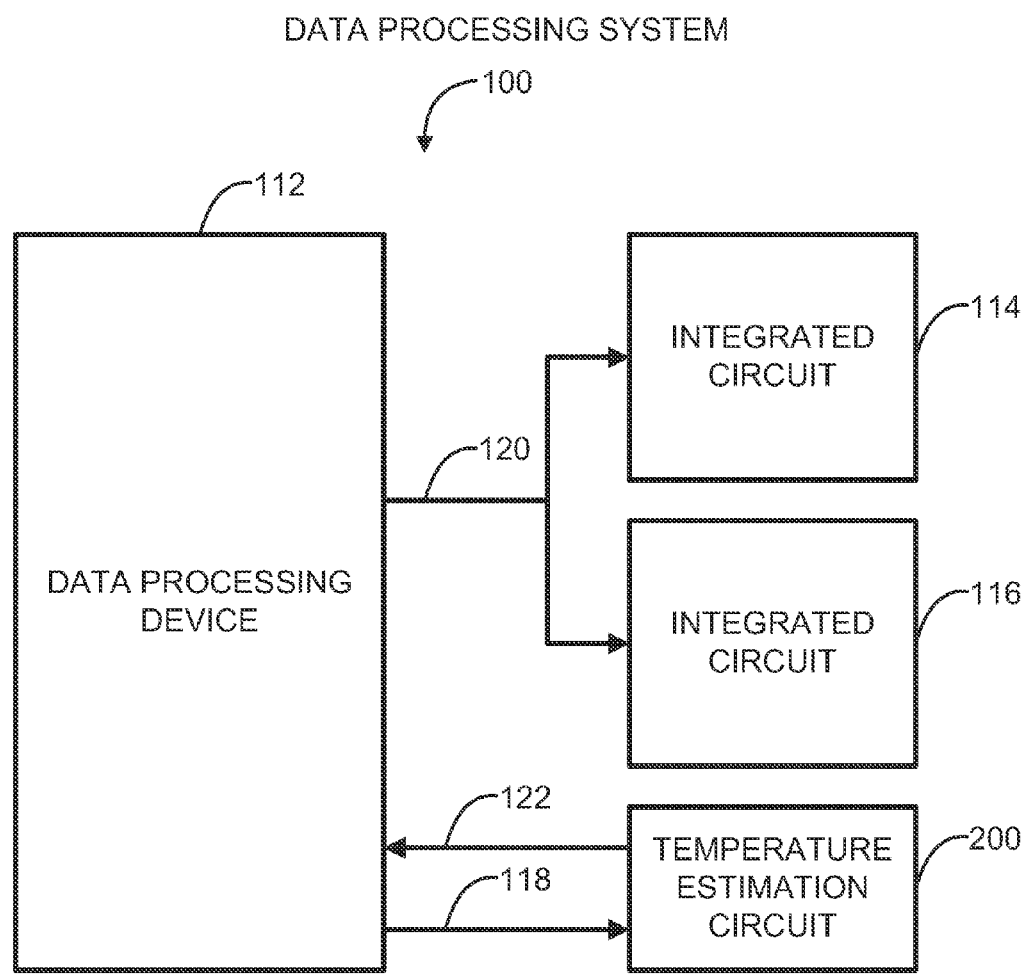
FIG. 1 schematically shows a block diagram of an example of an embodiment of a data processing system having a temperature estimation circuit.

Referring to FIG. 1, a block diagram of an example of an embodiment of a data processing system 100 having a temperature estimation circuit 200 is illustrated. FIG. 1 shows a data processing system 100, comprising an integrated circuit 114, 116 and a temperature estimation circuit 200 as described with reference to FIG. 2 below and a data processing device 112 operable to send one or more command signals 120 to the integrated circuit 114, 116 and one or more corresponding notification signals 118 to the temperature estimation circuit 200. A data processing system 100 may either be monolithic as a single chip or distributed across several chips on the same or different printed circuit boards. It may contains an integrated circuit 114, 116 that receives commands 120, usually from a data processing device 112, and receives and delivers data. It may also deliver commands itself. Due to reception of command signals 120, the current flow causes the integrated circuit 114, 116 to increase its temperature, for example caused by the movement of electrons across junctions of different semiconductive components of the integrated circuit. The data processing device 112 passing command signals to the integrated circuit may be, for example, a microcontroller or a digital signal processor (DSP) or a general purpose processor (GPP), such as a central processing unit (CPU) of a computer system. For example, it may be a PowerPC, i.e. a Performance Optimization With Enhanced Risc (Reduced instruction set computing) Performance Chip, such as Freescale's 5121 PowerPC telematics processor. However, it may also be a processor following a complex instruction set computing (CISC) principle or any other data processing device. The data processing device 112 may send command signals 120 to more than one integrated circuit device 114, 116, and more than one temperature estimation circuits 200 may calculate a corresponding estimated temperature 122 of the receiving integrated circuit device. It is also possible and within the scope of the described system, that one temperature estimation circuit is set up to calculate estimated temperatures for more than one integrated circuit device 114, 116 receiving command signals from the data processing device. The temperature estimation circuit may be implemented as an integrated circuit itself or may be part of a data processing device or may be implemented as a computer program product executed on the data processing device 112.

One embodiment of the data processing system 100 may have the data processing device 112 adjust a number of command signals 120 per unit time sent to the integrated circuit 114, 116 depending on a calculated die temperature value 122. The die temperature value 122 is provided by the temperature estimation circuit 200. The data processing device 112 may be set up to reduce the temperature of an integrated circuit device 114, 116 by reducing its load depending on the number of commands 120 sent to the integrated circuit. For example, if the integrated circuit device is one of a set of memory devices, the data processing device may decide to stop storing data to the memory device that encounters a temperature increase and use other available memory devices instead in order to avoid an overheating of the memory device, therefore avoiding reduced performance, data loss or temporary or even permanent device failure. The system could be used to enable operation within an allowed temperature range without the need for implementing additional temperature sensors, saving costs and reducing overall die size.

Figure 2:
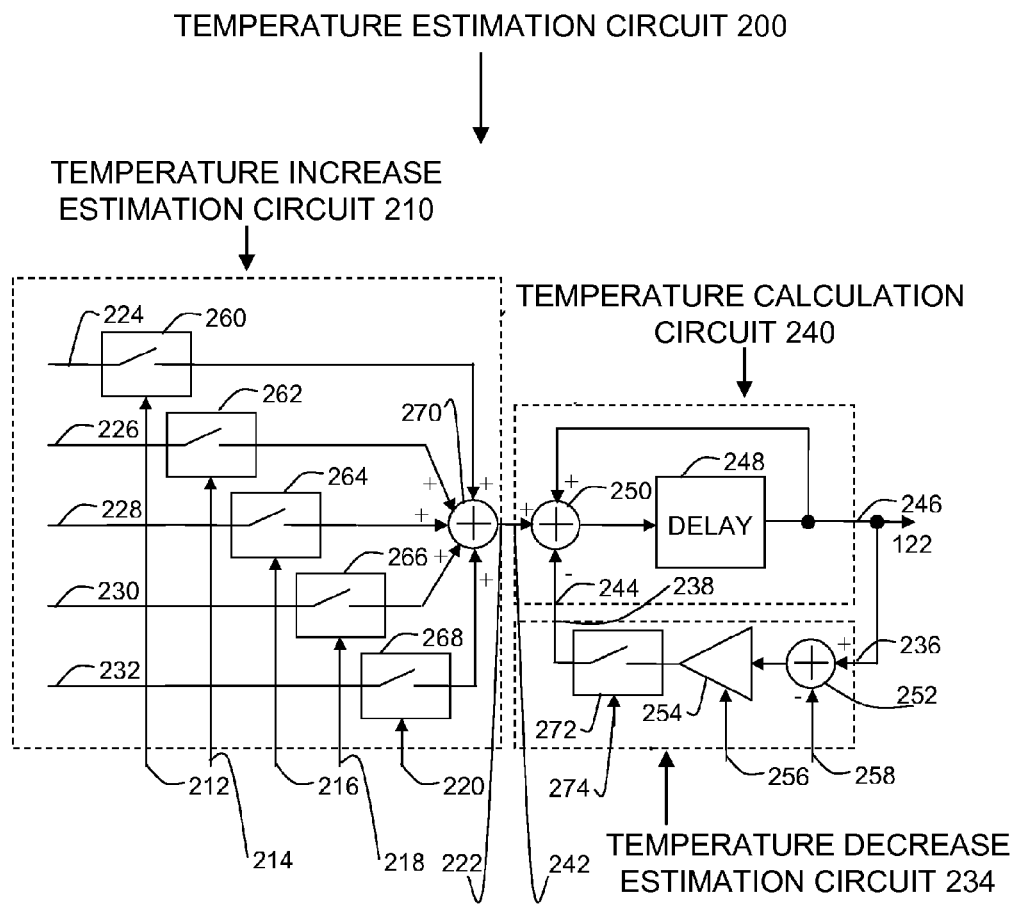
FIG. 2 schematically shows a block diagram of an example of an embodiment of a temperature estimation circuit.

Referring now also to FIG. 2, a block diagram of an example of an embodiment of a temperature estimation circuit 200 is shown. A temperature estimation circuit 200 for estimating a temperature of a die of an integrated circuit 114, 116 is disclosed, comprising a temperature increase estimation circuit 210, having one or more inputs 212-220 operable to receive one or more notification signals 118, each notification signal corresponding to a command signal 120 passed to the integrated circuit, and an output 222 providing a sum of one or more temperature increase values 224-232, each temperature increase value corresponding to a temperature increase of the integrated circuit 114, 116 due to one of the command signals 120; a temperature decrease estimation circuit 234, comprising an input 236 operable to receive a calculated die temperature value 122, and an output 238 providing a temperature decrease value depending on a mathematical model of temperature decrease when no command signal 120 is applied to the integrated circuit 114, 116; and a temperature calculation circuit 240, having a first input 242 connected to the output 222 of the temperature increase estimation circuit 210, a second input 244 connected to the output 238 of the temperature decrease estimation circuit 234, and an output 246 providing the calculated die temperature value 122. Although the described temperature increase circuit 210 receives notification signals 118 corresponding to the command signals 120 through its notification signal inputs 212-220, it may also be possible that the command signals 120 themselves are used as the notification signals 118.

The temperature calculation circuit 240 shown in FIG. 2 may comprise a delay element 248, and adder/subtractor 250 for calculating the die temperature value 122 from at least one previous die temperature value increased by the sum of one or more temperature increase values and decreased by the temperature decrease value. In an embodiment, the calculated temperature value may be the output value of a memory or delay element 248 receiving the output of an adder/subtractor 250, wherein the adder/subtractor 250 adds the sum of temperature increase values provided by the temperature increase estimation circuit 210 to the temperature value calculated during a previous clock cycle of the system clock fed back in a feedback loop and subtracts the temperature decrease value provided by the temperature decrease estimation circuit 234.

The temperature decrease estimation circuit 234 may provide the temperature decrease value as a scaled difference of the calculated die temperature value 122 and an estimated die temperature value when no command signal is applied to the integrated circuit. The temperature decrease value may be determined using a subtractor 252 receiving the calculated die temperature value 122 from the temperature calculation circuit and subtracting a junction temperature value during idle time of the integrated circuit, i.e. when it receives no command signals, received through input 258. The resulting value is applied to a scaler 254. Here the scaler amplifies or attenuates the output signal of the subtractor. A switch 272 may be used for applying the scaler 254 output signal to adder/subtractor 250. Switch 272 is controlled by a clock signal received through control input 274. The clock signal may have a fixed frequency depending on the actual implementation. It may be, for example, the overall system clock frequency or any other, e.g. 1 MHz. Each time switch 272 is closed, the temperature decrease value provided by scaler 254 is subtracted from the previous temperature value stored in delay element 248. The clock signal received through control input 274 may be generated within temperature decrease estimation circuit 234 or it may be received as an input to circuit 234. The applied scaling factor may match the time constant of the integrated circuit die depending on the system clock frequency. The time constant may be the constant of an exponential junction temperature decrease of the integrated circuit. It may be measured in advance, calculated from the physical parameters of the integrated circuit semiconducting device or deducted from a data sheet of the used integrated circuit. The usage of switch 274 refers to a time-discrete temperature estimation, as shown in FIG. 2. However, other embodiments of the described system may model temperature decrease as a time-continuous process, for example using a bleeding charge of a capacitor.

The difference provided by subtractor 252 may be scaled using a scaler 254 having a programmable scaling factor input 256. Hence, it will be possible to adjust the temperature decrease estimation circuit in combination with the temperature calculation circuit to model an exponential temperature decrease to the estimated junction temperature when idle. This decrease in junction temperature can be modelled with the first order low pass filter composed of temperature decrease estimation circuit and temperature calculation circuit. For many integrated circuits, for example D-RAMs, this model may match their thermal characteristics. However, it is within the scope of the presented system to implement other filters modelling other or the same thermal characteristics. For example, $2^{nd}$ order or $3^{rd}$ order finite impulse response (FIR) filters may be used, whose coefficients may be obtained from thermal measurements or simulations of the integrated circuit.

This estimated junction temperature when idle is the estimated die temperature value when no command signal is applied to the integrated circuit 114, 116 and may be permanently stored within the decrease estimation circuit. However, in order to adjust the temperature estimation circuit 200 to different integrated circuits or to consider differing idle temperature values depending on the current ambient temperature, the temperature decrease estimation circuit may comprise an input 258 for applying the estimated die temperature value when no command signal is applied to the integrated circuit.

The sum of temperature increase values may be determined using an adder 270 adding the output signal values of a set of switches 260-268 controlled by the set of notification signals applied via inputs 212-220. Each command signal 120 passed to the integrated circuit 114, 116 generates a notification signal 118 that triggers one of the switches 260-268 to connect the applied input value with the adder 270. The temperature increase estimation circuit 210 may comprise one or more switches 260-268, each switch having an input for one of the temperature increase values 224-232, each temperature increase value corresponding to a temperature increase of the integrated circuit 114, 116 due to one of the command signals 120. The temperature increase values 224-232 may be permanently stored within the temperature increase estimation circuit, for example using a static look-up table. However, in order to adjust the values with respect to the measured integrated circuit 114, 116, changes of ambient temperature over time, an independent programming of the used values 224-232 may be desired. Therefore, the temperature increase estimation circuit 210 may comprise one or more inputs operable to receive the one or more temperature increase values 224-232. These values may be measured in advance, calculated from the physical parameters of the integrated circuit semiconducting device or deducted from a data sheet of the used integrated circuit.

The temperature estimation circuit 200 may estimate the temperature of any integrated circuit device 114, 116. The integrated circuit may even be the data processing device itself, estimating its own temperature. And the temperature estimation circuit may be implemented as part of the data processing device itself. However, in another embodiment of the data processing system, the integrated circuit 114, 116 may be a memory device. Devices frequently receiving commands 120 will especially be subject to temperature increase. It may be sufficient to model only the most frequently used commands. For many applications, memory devices are frequently used by the data processing device 112. Often volatile data storages losing their stored data when power supply is interrupted are used. RAM (random access memory) chips receive many command signals 120 per second and are subject to self-heating. This relates to any type of RAM. However, since dynamic RAM (D-RAM) chips require a periodical refresh since the capacitor charges used for storing information bits tend to fade, D-RAM or double data rate (DDR)-DRAM memory chips may especially benefit from a temperature estimation and control. Furthermore, in one embodiment, a D-RAM controller may be integrated within a data processing device, allowing to send command signals to the D-RAM even more frequently. For example, if the integrated circuit 114, 116 is a D-RAM chip, it may receive a "D-RAM activate" command (D-RAM ACT cmd), "D-RAM precharge" command (D-RAM PRE cmd), "D-RAM read" command (D-RAM READ cmd), "D-RAM write" command (D-RAM WRITE cmd), and "D-RAM refresh" command (D-RAM REFRESH cmd). These commands 120 may be directly used as notification signals 118 for the temperature increase estimation circuit 210, triggering switches 260-268 to apply corresponding temperature increase values $K_{act}$ (for D-RAM activate) 224, $K_{pre}$ (for D-RAM precharge) 226, $K_{read}$ (for D-RAM read) 228, $K_{write}$ (for D-RAM write) 230, and $K_{ref}$ (for D-RAM refresh) 232 to adder 270. For certain applications, a D-RAM chip may have an operating temperature of about 85° C. and may start malfunctioning at about 95° C. Therefore, a temperature surveillance can be provided by the described temperature estimation circuit and, if required, temperature reduction by the data processing device by sending less commands to the D-RAM that is about to overheat. Anyway, also non-volatile memory, such as an EPROM (Erasable Programmable Read-Only Memory) or an EEPROM (Electrically EPROM), may benefit from temperature estimation and overheating prevention.

Figure 3:
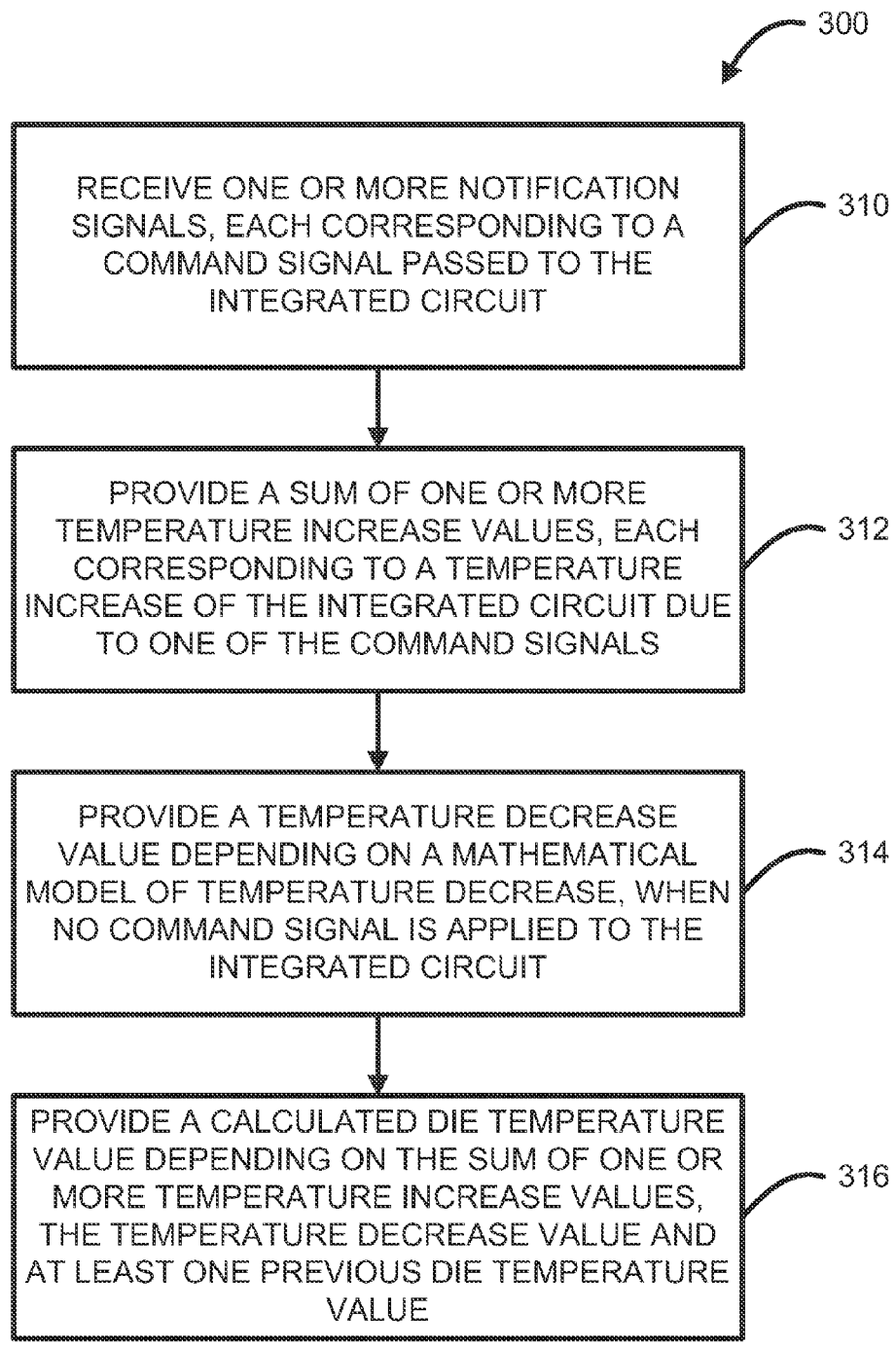
FIG. 3 schematically shows a flow diagram of an example of an embodiment of a method for estimating a temperature of an integrated circuit die.

Referring now also to FIG. 3, a schematic flow diagram 300 of an example of an embodiment of a method for estimating a temperature of a die of an integrated circuit die 114, 116 is illustrated, comprising receiving 310 one or more notification signals 118, each notification signal corresponding to a command signal 120 passed to the integrated circuit 114, 116; providing 312 a sum of one or more temperature increase values 224-232, each temperature increase value corresponding to a temperature increase of the integrated circuit due to one of the command signals 120; providing 314 a temperature decrease value depending on a mathematical model of temperature decrease, when no command signal 120 is applied to the integrated circuit 114, 116; and providing 316 a calculated die temperature value 122 depending on the sum of one or more temperature increase values, the temperature decrease value and at least one previous die temperature value. The described method allows implementing the advantages and characteristics of the described temperature estimation circuit as part of a method for estimating a temperature of an integrated circuit die.

Figure 4:
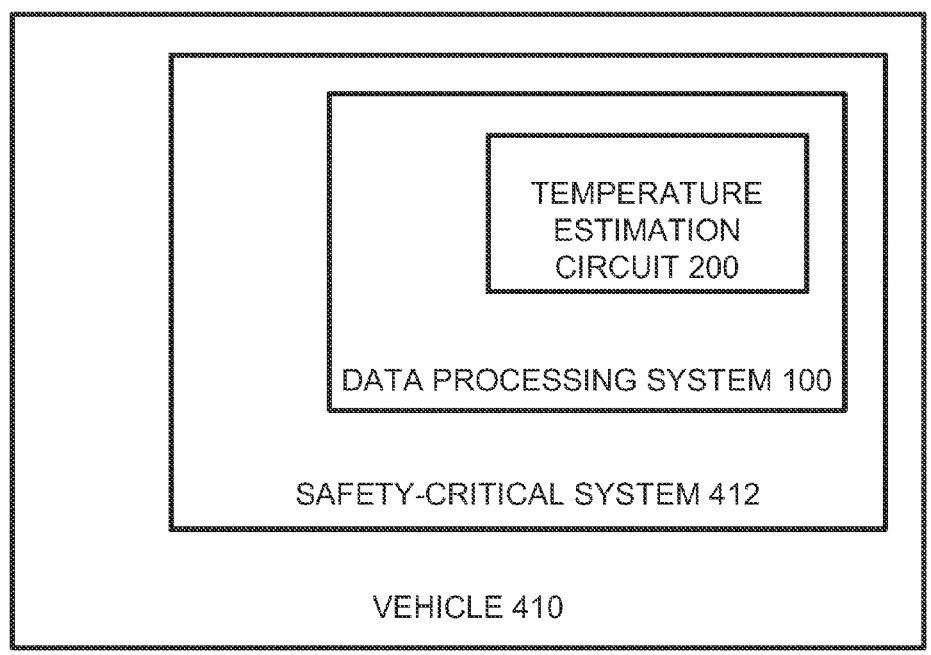
FIG. 4 schematically shows a block diagram of an example of an embodiment of a vehicle with a safety-critical system.

Referring now also to FIG. 4, a block diagram of an example of an embodiment of a vehicle 410 with a safety-critical system 412 is shown. A safety-critical system 412 may comprise a data processing system 100 or a temperature estimation circuit 200 or may use a method as described above. And a vehicle 410 may comprise a safety-critical system 412, a data processing system 100, or a temperature estimation circuit 200 or may use a method as described above. A safety-critical system 412 is a system used in an environment where safety and avoidance of system failure is a critical issue and may be found in functional safety applications, such as vehicle 410 safety systems, for example brake or electrical steering system, where a malfunction could induce a dangerous situation for the driver and permanent temperature surveillance may help avoid overheating. A vehicle 410 may be a car. However, it may be any automotive apparatus, such as a plane, a ship, a helicopter etc.

The invention may also be implemented in a computer program for running on a computer system, the computer program product may comprise code portions for executing steps of a method for estimating a temperature of an integrated circuit die 114, 116 or for implementing parts of a temperature estimation circuit 200 or for implementing parts of a data processing system 100 as described above, when run on a programmable apparatus. The term "program," as used herein, is defined as a sequence of instructions designed for execution on a computer system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

All or some of the software described herein may be received elements of system 100, for example, from computer readable media such as memory or other media on other computer systems. Such computer readable media may be permanently, removably or remotely coupled to an information processing system such as system 100. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be an type of connection suitable to transfer signals from or to the respective nodes, units or devices, for example via intermediate devices. Accordingly, unless implied or stated otherwise the connections may for example be direct connections or indirect connections.

The semiconductor substrate described herein can be any semiconductor material or combinations of materials, such as gallium arsenide, silicon germanium, silicon-on-insulator (SOI), silicon, monocrystalline silicon, the like, and combinations of the above.

Because the apparatus implementing the present invention is, for the most part, composed of electronic components and circuits known to those skilled in the art, circuit details have not been explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 2 and the discussion thereof describe an exemplary temperature estimation circuit architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 100 may be circuitry located on a single integrated circuit or within a same device. Alternatively, system 100 may include any number of separate integrated circuits or separate devices interconnected with each other. For example, data processing device 112 may be located on a same integrated circuit as temperature estimation circuit 200 or on a separate integrated circuit or located within another peripheral or slave discretely separate from other elements of system 100. Peripheral integrated circuit 114, 116 may also be located on a separate integrated circuit die. Also for example, system 100 or portions thereof may be soft or code representations of physical circuitry or of logical representations convertible into physical circuitry. As such, system 100 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

Also, devices functionally forming separate devices may be integrated in a single physical device. For example, temperature estimation circuit 200 may be part of the data processing device 112.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A temperature estimation circuit for estimating a temperature of a die of an integrated circuit, comprising:
   a temperature increase estimation circuit, having one or more inputs operable to receive one or more notification signals, each notification signal corresponding to a command signal passed to said integrated circuit, and
   having an output operable to provide a sum of one or more temperature increase values, each temperature increase value corresponding to a temperature increase of said integrated circuit due to one of said command signals;
   a temperature decrease estimation circuit, comprising:
      an input operable to receive a calculated die temperature value, and
      an output operable to provide a temperature decrease value depending on a mathematical model of temperature decrease, when no command signal is applied to said integrated circuit; and
   a temperature calculation circuit, having
      a first input connected to said output of said temperature increase estimation circuit,
      having a second input connected to said output of said temperature decrease estimation circuit, and
      having an output operable to provide said calculated die temperature value.

2. The temperature estimation circuit as claimed in claim 1, wherein said temperature calculation circuit comprises a calculator for calculating said die temperature value from at least one previous die temperature value increased by said sum of one or more temperature increase values and decreased by said temperature decrease value.

3. The temperature estimation circuit as claimed in claim 2, wherein said temperature decrease estimation circuit is arranged to provide said temperature decrease value as a scaled difference of said calculated die temperature value and an estimated die temperature value when no command signal is applied to said integrated circuit.

4. The temperature estimation circuit as claimed in claim 2, wherein said temperature increase estimation circuit comprises one or more switches, each switch having an input for one of said temperature increase values, each temperature increase value corresponding to a temperature increase of said integrated circuit due to one of said command signals.

5. The temperature estimation circuit as claimed in claim 2, wherein said temperature increase estimation circuit comprises one or more inputs operable to receive said one or more temperature increase values.

6. The temperature estimation circuit as claimed in claim 2, wherein said integrated circuit is a memory device.

7. The temperature estimation circuit as claimed in claim 1, wherein said temperature decrease estimation circuit is arranged to provide said temperature decrease value as a scaled difference of said calculated die temperature value and an estimated die temperature value when no command signal is applied to said integrated circuit.

8. The temperature estimation circuit as claimed in claim 7, wherein said difference is scaled using a scaler having a programmable scaling factor input.

9. The temperature estimation circuit as claimed in claim 8, wherein said temperature decrease estimation circuit comprises an input for applying said estimated die temperature value when no command signal is applied to said integrated circuit.

10. The temperature estimation circuit as claimed in claim 8, wherein said temperature increase estimation circuit comprises one or more switches, each switch having an input for one of said temperature increase values, each temperature increase value corresponding to a temperature increase of said integrated circuit due to one of said command signals.

11. The temperature estimation circuit as claimed in claim 7, wherein said temperature decrease estimation circuit comprises an input for applying said estimated die temperature value when no command signal is applied to said integrated circuit.

12. The temperature estimation circuit as claimed in claim 7, wherein said temperature increase estimation circuit comprises one or more switches, each switch having an input for one of said temperature increase values, each temperature increase value corresponding to a temperature increase of said integrated circuit due to one of said command signals.

13. The temperature estimation circuit as claimed in claim 7, wherein said temperature increase estimation circuit comprises one or more inputs operable to receive said one or more temperature increase values.

14. The temperature estimation circuit as claimed in claim 7, wherein said integrated circuit is a memory device.

15. The temperature estimation circuit as claimed in claim 1, wherein said temperature increase estimation circuit comprises one or more switches, each switch having an input for one of said temperature increase values, each temperature increase value corresponding to a temperature increase of said integrated circuit due to one of said command signals.

16. The temperature estimation circuit as claimed in claim 1, wherein said temperature increase estimation circuit comprises one or more inputs operable to receive said one or more temperature increase values.

17. The temperature estimation circuit as claimed in claim 1, wherein said integrated circuit is a memory device.

18. A method for estimating a temperature of a die of an integrated circuit, comprising:
    receiving one or more notification signals, at a temperature increase estimation device, from a data processing device, each notification signal corresponding to a command signal passed to said integrated circuit;
    providing to a temperature calculation device, from the temperature increase estimation device, a sum of one or more temperature increase values, each temperature increase value corresponding to a temperature increase of said integrated circuit due to one of said command signals;
    providing to the temperature calculation device, from a temperature decrease estimation device, a temperature decrease value depending on a mathematical model of temperature decrease, when no command signal is applied to said integrated circuit; and
    providing to the data processing device, from the temperature calculation device, a calculated die temperature value depending on said sum of one or more temperature increase values, said temperature decrease value, and at least one previous die temperature value.

19. A data processing system, comprising the integrated circuit and the temperature estimation circuit as claimed in claim 1 and a data processing device operable to send one or more command signals to said integrated circuit and one or more corresponding notification signals to said temperature estimation circuit.

20. The data processing system as claimed in claim 19, wherein said data processing device adjusts a number of command signals per unit time sent to said integrated circuit depending on said calculated die temperature value.

* * * * *